United States Patent
Yee

(10) Patent No.: US 6,304,088 B1
(45) Date of Patent: *Oct. 16, 2001

(54) VOLTAGE MONITOR CIRCUIT WITH ADJUSTABLE HYSTERESIS USING A SINGLE COMPARATOR

(75) Inventor: Philip W. Yee, Los Altos, CA (US)

(73) Assignee: Micrel Incorporated, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/316,528

(22) Filed: May 21, 1999

(51) Int. Cl.$^7$ .................................................. G10N 27/416
(52) U.S. Cl. .............................................. 324/433
(58) Field of Search ...................... 324/426, 433; 320/132, 149, DIG. 19, DIG. 21; 340/635, 636

(56) References Cited

U.S. PATENT DOCUMENTS 4,272,806 * 6/1981 Metzger .
4,316,185 * 2/1982 Watrous et al. .
4,797,608 * 1/1989 White .

FOREIGN PATENT DOCUMENTS 197 32 671  4/1998  (DE) .
0 709 687   5/1996  (EP) .
04 313070  11/1992  (JP) .
06 324091  11/1994  (JP) .
10 197572   7/1998  (JP) .

* cited by examiner

Primary Examiner—Edward H. Tso
(74) Attorney, Agent, or Firm—Skjerven Morrill MacPherson LLP; Carmen C. Cook; Brian D. Ogonowsky

(57) ABSTRACT

A voltage monitor circuit for monitoring a first voltage includes a switch and a comparator. The switch has a first position and a second position. When the switch is in the first position, the switch connects the comparator to a first voltage terminal to monitor a second voltage. When the switch is in the second position, the switch connects the comparator to a second voltage terminal to monitor a third voltage. The second and third voltages are scaled voltages of the first voltage to be monitored. The comparator provides an output signal indicating a status of the first voltage, that is, whether the first voltage is within an operative range. The voltage monitor circuit may further include a voltage divider connected between the first voltage and a ground potential. The voltage monitor circuit of the present invention can be incorporated in an electrical system for monitoring a battery voltage. The voltage monitor circuit uses a user adjustable hysteresis to preclude operation of the electrical system under the "bounce back" voltage. The voltage monitor circuit utilizes a single comparator and allows the user-selected hysteresis to be reproduced precisely in the monitor circuit.

17 Claims, 3 Drawing Sheets

VOLTAGE MONITOR CIRCUIT WITH ADJUSTABLE HYSTERESIS USING A SINGLE COMPARATOR

BACKGROUND OF THE INVENTION

1. Field of the Invention

The present invention generally relates to a voltage monitor circuit.

2. Background of the Invention

A voltage monitor circuit is included in an electrical device such as a cellular telephone or a personal digital assistant (PDA) for monitoring the voltage level of a battery used to operate the device. The voltage monitor circuit ensures that the electrical device is operative only when a desired minimum level of battery voltage is present. When the battery voltage falls below the desired minimum voltage level, the voltage monitor circuit signals the electrical device to shut down. The voltage monitor circuit inhibits further operation of the electrical device until the battery voltage is restored.

FIG. 1 illustrates the typical behavior of the battery voltage over time for a battery being operated in an electrical device. In FIG. 1, it is assumed that a fully charged battery is inserted into the electrical device at time T0. When a fully charged battery is inserted, the battery voltage as seen by the electrical device increases rapidly (but not immediately due to the charging of capacitors) to a maximum voltage value as shown by curve 12a. A voltage monitor circuit associated with the electrical device detects when the battery voltage increases to a value greater than a predefined low threshold voltage, $V_T(Low)$, and signals the electrical device to begin operation. The battery voltage decreases as the battery charge is consumed (curve 12b). When the battery voltage falls below the low threshold voltage, VT(Low), at time T2 in FIG. 1, the voltage monitor circuit detects the low voltage condition and signals the electrical device to shut down its circuits. Ideally, the electrical device should not operate again until the battery charge is fully restored or restored to a sufficiently high level. However, as described below, the electrical device is often caused to operate before the battery is restored sufficiently because the battery voltage exhibits the well-known phenomenon called "bounce back" as illustrated by curve 12c in FIG. 1.

Because the battery voltage is load dependent, when the electrical device shuts down its circuits, the load on the battery is reduced and the battery voltage will recover to a value above the low threshold voltage, $V_T(Low)$. The electrical device sees what is apparently a valid operating voltage on the battery and turns on its circuit again. However, because only minimal battery charge actually remains, the battery voltage will almost immediately fall below the low threshold level $V_T(Low)$ again and the device will have to shut off its circuits almost as soon as it turns them on. Therefore, it is undesirable to operate the device under what is called the "bounce back" voltage.

To prevent device operation under the "bounce back" voltage, conventional voltage monitor circuits are typically designed with hysteresis. Two threshold voltages are used to control the proper operation of an electrical device: a high threshold voltage, $V_T(High)$, and a low threshold voltage, $V_T(Low)$. Referring again to FIG. 1, when a voltage monitor circuit employs hysteresis, an electrical device will not turn on unless the battery voltage has reached $V_T(High)$ which is at time T1 in FIG. 1. After time T1, the electrical device will operate until the battery voltage falls below $V_T(Low)$ which occurs at time T2 in FIG. 1. After time T2, even though the battery voltage recovers to above $V_T(Low)$, the voltage monitor circuit will prevent the electrical device from turning on because the battery voltage has not increased above $V_T(High)$. In this manner, the voltage monitor circuit precludes operation under the "bounce back" voltage.

The amount of hysteresis, i.e., the voltage values of $V_T(Low)$ and $V_T(High)$, of a voltage monitor circuit is established based on the type of battery and the load placed on the battery by the electrical device or electrical system. The threshold voltages $V_T(Low)$ and $V_T(High)$ are optimized individually for each electrical device or electrical system in which a voltage monitor circuit operates.

FIG. 2 is a circuit schematic of a conventional voltage monitor circuit 20 with adjustable hysteresis. Voltage monitor circuit 20 includes a resistor network including serially connected resistors 24, 26, and 28, a first comparator 38, a second comparator 40, and a latch 48. The resistor network is connected across the battery voltage ($V_{BAT}$) to be monitored (node 22) and a ground potential (node 30). Resistors 24, 26, and 28 operate as a voltage divider to scale battery voltage $V_{BAT}$ down to provide two reference voltage levels for monitoring the battery voltage. A high battery voltage monitor level ($V_{High}$) is provided at node 34 between resistors 26 and 28. $V_{High}$ is a scaled voltage for monitoring a high level of the battery voltage. A low battery voltage monitor level ($V_{High}$) is provided at node 32 between resistors 24 and 26. $V_{Low}$ is a scaled voltage for monitoring a low level of the battery voltage.

First comparator 38 compares voltage $V_{Low}$ to a reference voltage $V_{Ref}$ (node 36). Because $V_{Low}$ is connected to the inverting input terminal of first comparator 38, first comparator 38 provides a low to high transition on output lead 42 when voltage $V_{Low}$ decreases from a value above $V_{Ref}$ to a value below $V_{Ref}$. Second comparator 40 compares voltage $V_{High}$ also to reference voltage $V_{Ref}$ (node 36). Because $V_{High}$ is connected to the non-inverting terminal of second comparator 40, second comparator 40 provides a low to high transition on output lead 44 when voltage $V_{High}$ increases from a value below $V_{Ref}$ to a value above $V_{Ref}$. Output lead 42 of first comparator 38 is connected to the reset terminal of latch 48. Output lead 44 of second comparator 40 is connected to the set terminal of latch 48. Latch 48 provides an output signal Power Good on output lead 50. Signal Power Good indicates the status of the battery voltage to the electrical device in which voltage monitor circuit 20 operates. When signal Power Good is at a high logic level, the battery charge is within the desirable operative range. When signal Power Good is at a low logic level, the battery charge is below the desirable operative range.

In operation, second comparator 40 monitors the positive-going transition of battery voltage $V_{BAT}$, that is, the increase in battery voltage illustrated by curve 12a in FIG. 1. At time T0, signal Power Good is low and voltage monitor circuit 20 is monitoring voltage $V_{High}$. Between time T0 and T1, the battery voltage is below $V_T(High)$, thus, voltage $V_{High}$ is less than $V_{Ref}$ and the output of comparator 40 is at a low logic level. Latch 48 is not set and signal Power Good remains at a low logic level. At time T1, the battery voltage reaches $V_T(High)$, voltage $V_{High}$ is now greater than $V_{Ref}$ and output lead 44 of second comparator 40 transitions to a high logic level, setting latch 48. Signal Power Good transitions to a high logic level as a result. Voltage monitor circuit 20 then monitors voltage $V_{Low}$. Between time T1 and T2, the battery voltage is above $V_T(Low)$. Thus, $V_{Low}$ is greater than $V_{Ref}$ and output lead 42 is at a low logic level. Signal Power Good remains set to a high logic level. At time T2, when the battery voltage drops below $V_T(Low)$, first comparator 38 provides a high logic level output on lead 42 causing latch 48 to reset. Signal Power Good thus transitions to a low logic level. Signal Power Good will remain at a low logic level, indicating inoperative battery charge, until second comparator 40 detects that the battery voltage has increased above $V_T$(High) again. In this manner, voltage monitor circuit 20 ensures that no chattering occurs on signal Power Good and the electrical device will not be operated under the "bounce back" voltage.

The conventional voltage monitor circuit such as circuit 20 in FIG. 2 has several disadvantages. First, in voltage monitor circuit 20, latch 48 effects the hysteresis for the monitor circuit as a whole and prevents chattering of signal Power Good on output lead 50. However, each of comparators 38 and 40 must have its own hysteresis to prevent chattering of the comparator output (i.e. output leads 42 and 44). The hysteresis required for each of the comparators degrades the offset of the comparator and compromises the accuracy of voltage monitor circuit 20.

Secondly, the use of two comparators complicates system design. The two-comparator circuit requires a system designer to manage two separate and unrelated comparator offset values, further degrading the performance of the monitor circuit. If trimming is needed to improve the comparator offset, then at least two separate trims must be performed.

Lastly, voltage monitor circuit 20, including two comparators and a latch, not only consumes more power, but also results in a larger device size. When voltage monitor circuit 20 is implemented as an integrated circuit, the two-comparator and latch design consumes valuable die area and increases the cost of fabrication. Furthermore, power consumption is increased by internal transitions occurring in comparators 38 and 40 that do not affect output signal Power Good.

Therefore, it is desirable to provide a voltage monitor circuit with adjust hysteresis using only a single comparator and avoiding the disadvantages mentioned above.

SUMMARY OF THE INVENTION

According to one embodiment of the present invention, a voltage monitor circuit includes a switch and a comparator. The switch has a first position, a second position, a switch control terminal, and a switch output terminal. The comparator has a non-inverting input terminal coupled to the switch output terminal of the switch, an inverting input terminal coupled to a first reference voltage, and an output terminal coupled to the switch control terminal. The output terminal of the comparator provides an output signal Power Good.

When the switch is in the first position, the switch connects the non-inverting input terminal of the comparator to a first voltage terminal to monitor a first voltage. When the switch is in the second position, the switch connects the non-inverting input terminal of the comparator to a second voltage terminal to monitor a second voltage. The first and second voltages are scaled voltages of a third voltage to be monitored. The output signal Power Good provides a status of the third voltage, indicating whether the third voltage is within an operative range or outside the operative range.

In one embodiment, the first voltage is a scaled voltage for monitoring a low voltage level of the third voltage. In another embodiment, the second voltage is a scaled voltage for monitoring a high voltage level of the third voltage.

In yet another embodiment, the voltage monitor circuit further includes a voltage divider connected between the third voltage and a ground potential. The voltage divider operates to scale the third voltage to generate the first and second voltages. In one embodiment, the voltage divider is implemented as a three-resistor network. A first, second, and third resistors are connected in series between the third voltage and the ground potential.

The voltage monitor circuit of the present invention can be incorporated in an electrical system or an electrical device for monitoring a battery voltage. The voltage monitor circuit of the present invention uses hysteresis to preclude operation of the electrical system under the "bounce back" voltage. The voltage monitor circuit of the present invention utilizes a single comparator. Therefore, the full voltage range of the hysteresis of the monitor circuit is applied entirely to the comparator, thus achieving the most optimal operating condition. The single comparator structure of the voltage monitor circuit of the present invention allows the user-selected hysteresis to be reproduced precisely in the monitor circuit. The voltage monitor circuit of the present invention reduces manufacturing cost by reducing the number of circuit components required and the physical size of the circuit.

According to another aspect of the present invention, a method for monitoring a status of a first voltage includes the steps of: (a) monitoring a second voltage, the second voltage being scaled to indicate a high voltage level of the first voltage; (b) comparing the second voltage to a first reference voltage; (c) generating an output signal to indicate a first status of the first voltage when the second voltage is less than the first reference voltage; (d) generating the output signal to indicate a second status of the first voltage when the second voltage is greater than the first reference voltage; and (e) switching to monitor a third voltage when the output signal indicates the second status.

According to another aspect of the present invention, the method for monitoring a status of a first voltage may further include the steps of: (f) monitoring the third voltage, the third voltage being scaled to indicate a low voltage level of the first voltage; (g) comparing the third voltage to the first reference voltage; (h) generating the output signal to indicate the second status of the first voltage when the third voltage is greater than the first reference voltage; (i) generating the output signal to indicate the first status of the first voltage when the third voltage is less than the first reference voltage; and (j) switching to monitor the second voltage when the output signal indicates the first status.

The present invention is better understood upon consideration of the detailed description below and the accompanying drawings.

BRIEF DESCRIPTION OF THE DRAWINGS

In the present disclosure, like objects which appear in more than one figure are provided with like reference numerals.

DETAILED DESCRIPTION OF THE PREFERRED EMBODIMENTS

Figure 3:
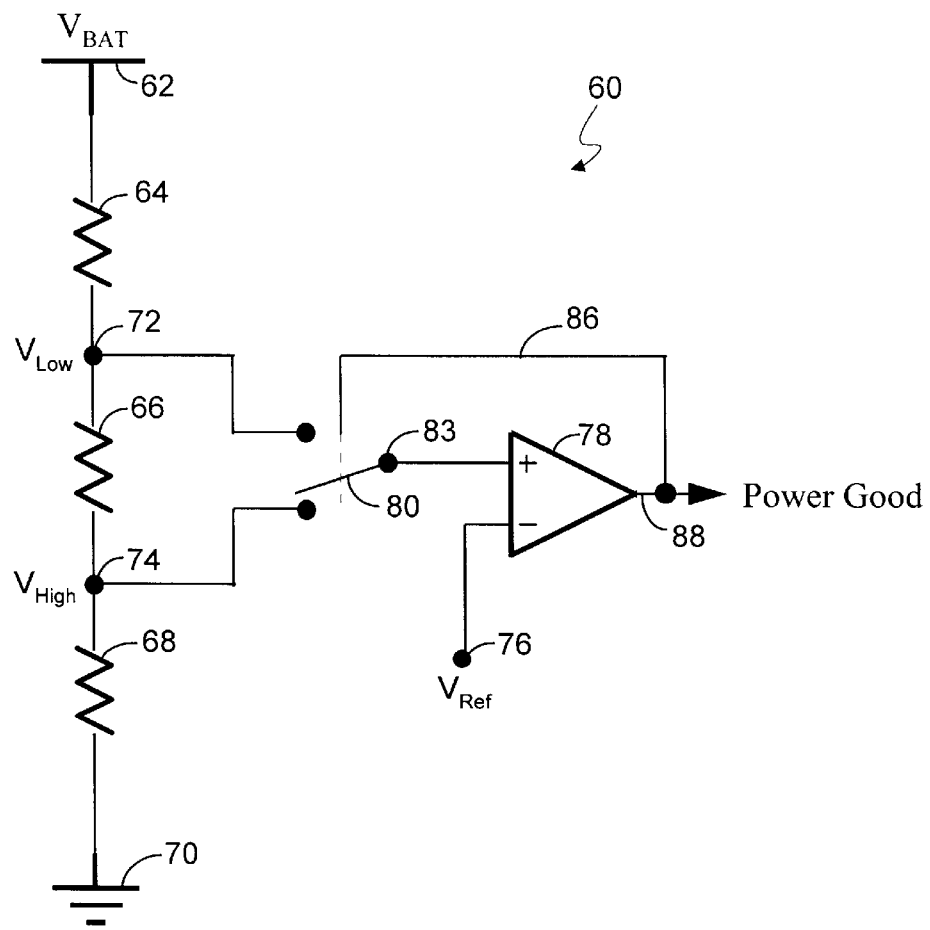
FIG. 3 is a circuit schematic of a voltage monitor circuit with adjustable hysteresis according to one embodiment of the present invention.

FIG. 3 is a circuit schematic of a voltage monitor circuit 60 according to one embodiment of the present invention.

Voltage monitor circuit 60 includes a resistor network, a switch 80, and a comparator 78.

The resistor network of voltage monitor circuit 60 includes resistors 64, 66, and 68, connected in series across a battery voltage ($V_{BAT}$) to be monitored (node 62) and a ground potential (node 70).

Figure 2:
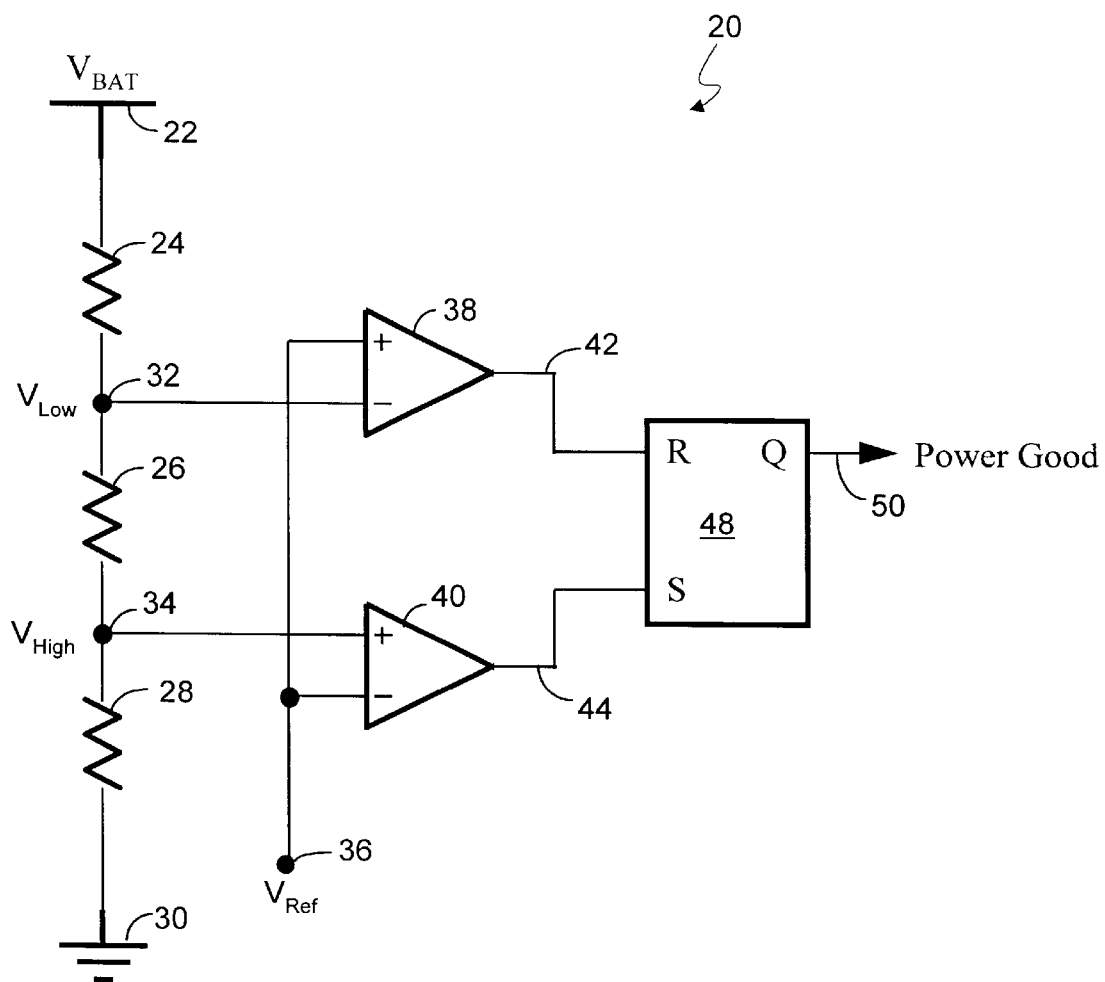
FIG. 2 is a circuit schematic of a conventional voltage monitor circuit with adjustable hysteresis.

The resistor network of voltage monitor circuit 60 operates in the same way as the resistor network of voltage monitor circuit 20 of FIG. 2. Resistors 64, 66, and 68 form a voltage divider to scale down voltage $V_{BAT}$ for providing two reference voltage levels for monitoring the battery voltage. A high voltage monitor level ($V_{High}$) is provided at node 74 between resistors 66 and 68. $V_{High}$ is a scaled voltage for monitoring a high level of the battery voltage. A low voltage monitor level ($V_{Low}$) is provided at node 72 between resistors 64 and 66. $V_{Low}$ is a scaled voltage for monitoring a low level of the battery voltage.

In the present embodiment, voltage monitor circuit 60 is described with respect to the monitoring of a battery voltage. However, the reference to a battery voltage is illustrative only and is not intended to limit the present invention to the monitoring of a battery voltage only. The voltage monitor circuit of the present invention can be used to monitor any voltages and provide an output signal indicative of the value or a status of the voltage being monitored. Furthermore, in the present embodiment, a resistor network of three resistors is employed to scale the battery voltage to provide the desired high and low monitor voltage levels. However, one skilled in the art will appreciate that other resistor configurations may be used, such as a four-resistor network, to provide the same voltage scaling as the three-resistor network in the present embodiment. Other voltage divider networks, not just using resistors, may also be used.

The resistance of each of resistors 64, 66, and 68 is selected in the known ways to implement the desired amount of hysteresis in voltage monitor circuit 60. One skilled in the art will appreciate that the resistance values for resistors 64, 66, and 68 are selected to set the desired threshold voltages $V_T$(Low) and $V_T$(High) for the monitor circuit. In fact, the resistance values for resistors 64, 66, and 68 are chosen so that when $V_{BAT}$ equals $V_T$(High), monitor voltage $V_{High}$ equals a reference voltage $V_{Ref}$, and when $V_{BAT}$ equals $V_T$(Low), monitor voltage $V_{Low}$ equals the same reference voltage $V_{Ref}$.

Switch 80 of voltage monitor circuit 60 is a single pole-double throw switch. Switch 80 has a first position connecting its output terminal 83 to a voltage terminal coupled to node 72, which is the low voltage monitor level $V_{Low}$. Switch 80 has a second position connecting its output terminal 83 to another voltage terminal coupled to node 74, which is the high voltage monitor level $V_{High}$. Switch output terminal 83 is coupled to a non-inverting input terminal of comparator 78. Reference voltage $V_{Ref}$ is coupled to an inverting input terminal (node 76) of comparator 78. Comparator 78 generates an output signal Power Good on output lead 88 which is also coupled to a switch control terminal 86 of switch 80. When signal Power Good is at a low logic level, switch 80 is in the second position, connecting switch output terminal 83 to node 74. When signal Power Good is at a high logic level, switch 80 is in the first position, connecting switch output terminal 83 to node 72.

In operation, Signal Power Good provides an indication of the status of the battery charge or the battery voltage $V_{BAT}$ to be monitored. In the present embodiment, signal Power Good outputs a low logic level when battery voltage $V_{BAT}$ is not within the operative range, and outputs a high logic level when the battery voltage $V_{BAT}$ is within the operative range. Of course, one skilled in the art will appreciate that the polarity of signal Power Good can be reversed.

Figure 1:
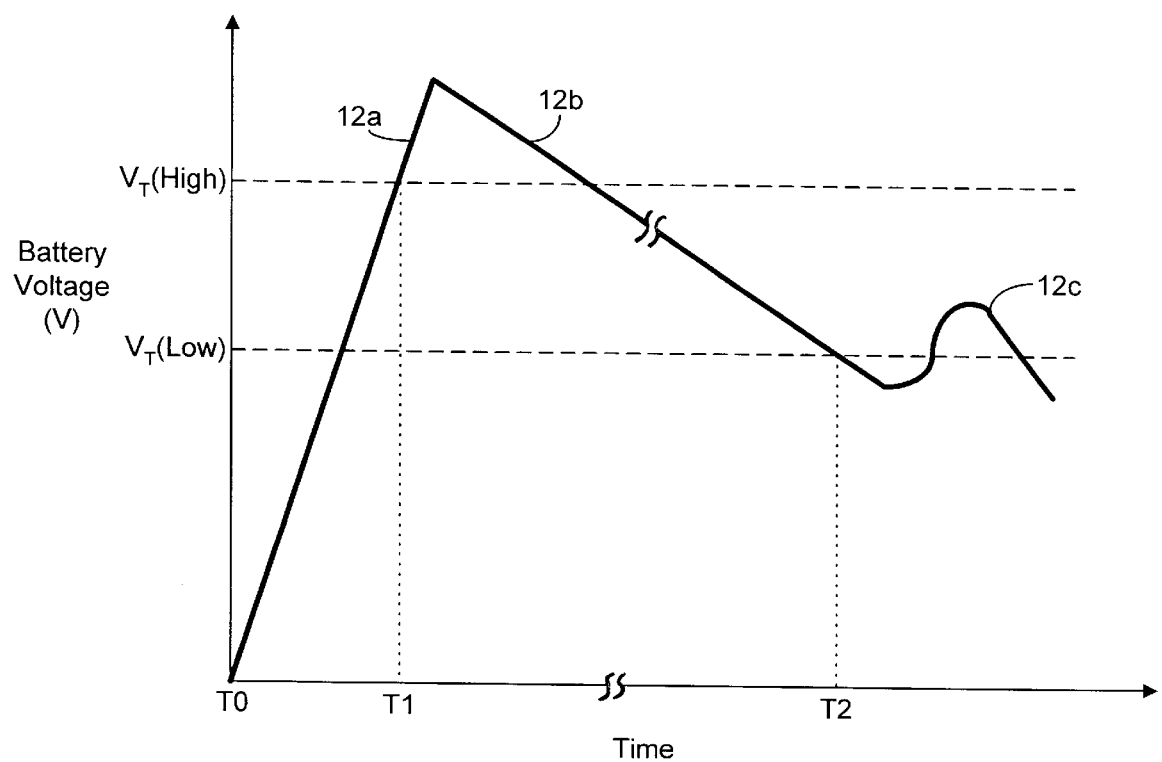
FIG. 1 is a plot illustrating the behavior of the voltage of a battery when operated over time in an electrical device.

The operation of voltage monitor circuit 60 is described with reference to FIG. 1. Assuming that at time T0, a fully charged battery is plugged into an electrical system in which voltage monitor circuit 60 is operating. Signal Power Good on lead 88 is initially set to a low state, indicating that the battery voltage is not within the operative range. The low state of signal Power Good causes switch 80 to be engaged in the second position. Thus, switch output terminal 83 is connected to high voltage monitor level $V_{High}$ (node 74) and voltage monitor circuit 60 monitors battery voltage $V_{BAT}$ to determine if $V_{BAT}$ has increased above the threshold voltage $V_T$(High). Between time T0 and T1, because battery voltage $V_{BAT}$ is less than $V_T$(High), monitor voltage $V_{High}$ is less than $V_{Ref}$ (node 76) and comparator 78 continues to output a low logic level on output lead 88. Signal Power Good remains at a logic low.

At time T1 when battery voltage $V_{BAT}$ has increased above threshold voltage $V_T$(High), monitor voltage VHigh becomes greater than $V_{Ref}$ and comparator 78 transitions to output a high logic level on signal Power Good (lead 88), indicating that the battery voltage is now within the operative range. Signal Power Good, coupled to switch control terminal 86, also causes switch 80 to transition to the first position (node 72). While signal Power Good is at a high state and battery voltage $V_{BAT}$ is within operative range (i.e. between time T1 and T2, switch 80 is in the first position and connected to node 72 to monitor voltage $V_{Low}$. Voltage monitor circuit 60 detects if battery voltage $V_{BAT}$ has decreased below the threshold voltage $V_T$(Low).

Between time T1 and T2, because battery voltage $V_{BAT}$ is greater than $V_T$(Low), monitor voltage $V_{Low}$ is greater than $V_{Ref}$ and comparator 78 provides a high logic level output on output lead 88. Signal Power Good remains at a high logic level until battery voltage $V_{BAT}$ decays below the threshold voltage $V_T$(Low) at time T2. When battery voltage $V_{BAT}$ decreases below $V_T$(Low), monitor voltage $V_{Low}$ is less than $V_{Ref}$ and comparator 78 transitions to provide a low logic level output on signal Power Good (output lead 88). The transition in signal Power Good causes switch 80 to be thrown back to the second position (connected to node 74). As previously described, when switch 80 is in the second position, voltage monitor circuit 60 monitors the high monitor voltage level $V_{High}$, and signal Power Good does not go to a high logic level until the battery voltage has been restored to a voltage level above the threshold voltage $V_T$(High). In this manner, voltage monitor circuit 60 successfully prevents operation of the electrical system under the "bounce back" voltage (curve 12c of FIG. 1).

The operation of voltage monitor circuit 60 effectuates self-latching of signal Power Good without the use of a separate latch circuit. In voltage monitor circuit 60, comparator 78 is operated under the most optimal condition whereby the full voltage range of the hysteresis (i.e., $V_T$(High) and $V_T$(Low)) is applied across comparator 78. Voltage monitor circuit 60 can be operated without any degradation due to hysteresis induced voltage offset in comparator 78.

The use of a single comparator in voltage monitor circuit 60 avoids all the shortcomings of the two-comparator implementation as in the conventional monitor circuits. Furthermore, the single-comparator implementation of voltage monitor circuit 60 has the advantage that the comparator offset is the same for both the positive-going and negative-going transitions in the battery voltage (curves 12a and 12b, respectively, in FIG. 1). Therefore, the user-selected hysteresis (i.e., threshold voltages $V_T$(Low) and $V_T$(High)) is reproduced precisely in voltage monitor circuit 60. Moreover, because only one comparator is used, only a single trim is needed to ensure accuracy for both the positive-going and negative-going transitions in the battery voltage. Of course, the single-comparator implementation in voltage monitor circuit 60 also reduces the size of the circuit and the associated manufacturing cost.

Figure 4:
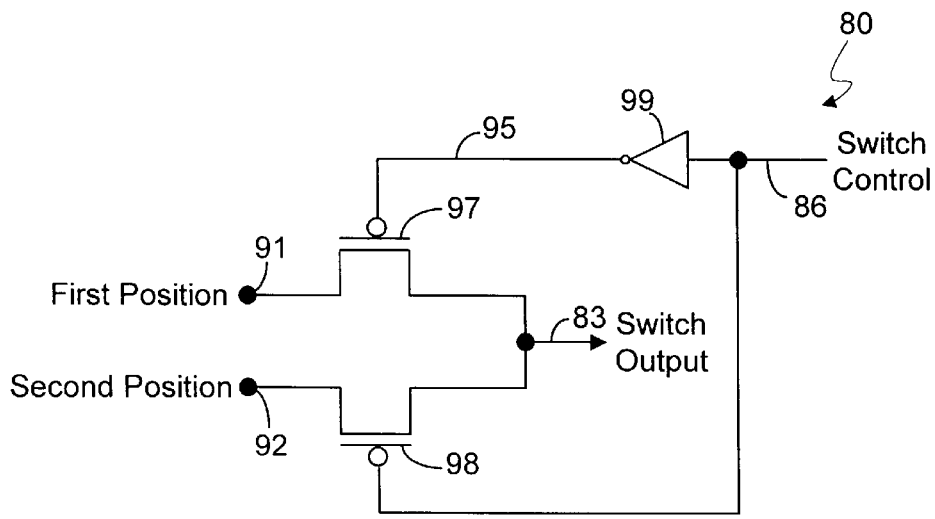
FIG. 4 is a circuit schematic illustrating one embodiment of switch 80 of the voltage monitor circuit of FIG. 3.

FIG. 4 is a circuit schematic illustrating one implementation of switch 80 of voltage monitor circuit 60. In the embodiment in FIG. 4, switch 80 is implemented as two p-channel MOS transistors 97, 98. Switch control terminal 86 receives a switch control signal which is connected directly to the control terminal of transistor 98. Meanwhile, the switch control signal is inverted by inverter 99 before being applied to the control terminal of transistor 97.

Transistors 97 and 98 are operating as MOS transmission gates. The drain terminals of transistors 97 and 98 are connected to switch output terminal 83. The source terminals of transistors 97 and 98 are connected to the voltage terminals associated with the first position and second position respectively of switch 80. Referring to voltage monitor circuit 60, first position node 91 of switch 80 is connected to node 72 of FIG. 3, and second position node 92 is connected to node 74 of FIG. 3.

Transistor 97 implements the first position of switch 80. When the switch control signal, i.e., the Power Good Signal, is at a high logic level, inverter 99 inverts the control signal and provides a low logic level output signal to the control terminal of transistor 97, turning transistor 97 on. Thus, transistor 97 connects first position node 91 to switch output terminal 83. Meanwhile, the switch control signal is driving transistor 98 with a high logic level, turning off transistor 98.

Transistor 98 implements the second position of switch 80. When the switch control signal, i.e. the Power Good Signal, is at a low logic level, the control signal on terminal 86 is applied directly to transistor 98, turning transistor 98 on. Transistor 98 connects second position node 92 to switch output terminal 83. Meanwhile, the switch control signal is inverted by inverter 99 and transistor 97 is being driven by a high logic level, turning off transistor 97.

FIG. 4 illustrates one implementation of switch 80 of voltage monitor circuit 60. One skilled in the art will appreciate that other embodiments of switch 80 are possible to provide the same operational requirements. For example, n-channel MOS transistors can be used instead of p-channel MOS transistors.

The above detailed description is provided to illustrate the specific embodiments of the present invention and is not intended to be limiting. Numerous modifications and variations within the scope of the present invention are possible. The present invention is defined by the appended claims thereto.

I claim:

1. A voltage monitor circuit comprising:
   a switch having a first position, a second position, a switch control terminal, and a switch output terminal; and
   a comparator having a first input terminal coupled to said switch output terminal of said switch, a second input terminal coupled to a first reference voltage, and an output terminal coupled to said switch control terminal, said output terminal providing an output signal;
   wherein said switch connects said first input terminal of said comparator to a first voltage terminal to monitor a first voltage when said switch is in said first position, and said switch connects said first input terminal of said comparator to a second voltage terminal to monitor a second voltage when said switch is in said second position, said first and second voltages being scaled voltages of a third voltage to be monitored.

2. The voltage monitor circuit of claim 1, wherein said first voltage is a scaled voltage for monitoring a low voltage level of said third voltage.

3. The voltage monitor circuit of claim 2, wherein said second voltage is a scaled voltage for monitoring a high voltage level of said third voltage.

4. The voltage monitor circuit of claim 2, wherein when said switch is in said first position, said output signal of said comparator has a first value when said first voltage is greater than said first reference voltage.

5. The voltage monitor circuit of claim 4, wherein said output signal of said comparator has a second value when said first voltage is less than said first reference voltage, said second value of said output signal causing said switch to be in said second position.

6. The voltage monitor circuit of claim 1, wherein said second voltage is a scaled voltage for monitoring a high voltage level of said third voltage.

7. The voltage monitor circuit of claim 6, wherein when said switch is in said second position, said output signal of said comparator has a first value when said second voltage is less than said first reference voltage.

8. The voltage monitor circuit of claim 7, wherein said output signal of said comparator has a second value when said second voltage is greater than said first reference voltage, said second value of said output signal causing said switch to be in said first position.

9. The voltage monitor circuit of claim 1, further comprising a voltage divider connected between said third voltage and a ground potential, said voltage divider scaling said third voltage to generate said first voltage coupled to said first voltage terminal, and said second voltage coupled to said second voltage terminal.

10. The voltage monitor circuit of claim 9, wherein said voltage divider comprises:
   a first resistor coupled between said third voltage and said first voltage terminal;
   a second resistor coupled between said first voltage terminal and said second voltage terminal, and
   a third resistor coupled between said second voltage terminal and said ground potential;
   said first, second, and third resistors having preselected resistance values for scaling said third voltage to said first and second voltages.

11. The voltage monitor circuit of claim 1, wherein said switch comprises:
   a first transistor having a first current handling terminal coupled to a first position input node of said switch, a second current handling terminal coupled to said switch output terminal, and a control terminal coupled to receive an inverted signal of said output signal of said comparator; and
   a second transistor having a first current handling terminal coupled to a second position input node of said switch, a second current handling terminal coupled to said switch output terminal, and a control terminal coupled to receive said output signal of said comparator.

12. The voltage monitor circuit of claim 1, wherein said third voltage is a battery voltage.

13. A battery voltage monitor circuit comprising:

a first resistor coupled between a battery voltage and a first voltage terminal, said first voltage terminal providing a first voltage;

a second resistor coupled between said first voltage terminal and a second voltage terminal, said second voltage terminal providing a second voltage;

a third resistor coupled between said second voltage terminal and a ground potential;

said first, second, and third resistors scaling said battery voltage to provided said first and second voltages, said first voltage for monitoring a low battery voltage level, said second voltage for monitoring a high battery voltage level;

a switch having a first position, a second position, a switch control terminal, and a switch output terminal, said switch connecting said switch output terminal to said first voltage terminal when said switch is in said first position, and said switch connecting said switch output terminal to said second voltage terminal when said switch is in said second position; and a comparator having a first input terminal coupled to said switch output terminal of said switch, a second input terminal coupled to a first reference voltage, and an output terminal coupled to said switch control terminal, said output terminal providing an output signal indicative of a status of said battery voltage.

14. A method for monitoring a status of a first voltage, said method comprising the steps of:

monitoring a second voltage, said second voltage scaled to indicate a high voltage level of said first voltage;

comparing said second voltage to a first reference voltage;

generating an output signal to indicate a first status of said first voltage when said second voltage is less Man said first reference voltage;

generating said output signal to indicate a second status of said first voltage when said second voltage is greater than said first reference voltage; and switching to monitor a third voltage when said output signal indicates said second status, wherein said switching is controlled solely by said output signal.

15. The method of claim 14 further comprising the steps of:

monitoring said third voltage, said third voltage scaled to indicate a low voltage level of said first voltage;

comparing said third voltage to said first reference voltage;

generating said output signal to indicate said second status of said first voltage when said third voltage is greater than said first reference voltage;

generating said output signal to indicate said first status of said first voltage when said third voltage is less than said first reference voltage; and switching to monitor said second voltage when said output signal indicates said first status wherein said switching is controlled solely by said output signal.

16. A method for monitoring a status of a first voltage, said method comprising the steps of:

monitoring a second voltage, said second voltage scaled to indicate a low voltage level of said first voltage;

comparing said second voltage to a first reference voltage;

generating an output signal to indicate a first status of said first voltage when said second voltage is greater than said first reference voltage;

generating said output signal to indicate a second status of said first voltage when said second voltage is less than said first reference voltage; and switching to monitor a third voltage when said output signal indicates said second status, wherein said switching is controlled solely by said output signal.

17. The method of claim 16 further comprising the steps of:

monitoring said third voltage, said third voltage scaled to indicate a high voltage level of said first voltage;

comparing said third voltage to said first reference voltage;

generating said output signal to indicate said second status of said first voltage when said third voltage is less than said first reference voltage;

generating said output signal to indicate said first status of said first voltage when said third voltage is greater than said first reference voltage; and switching to monitor said second voltage when said output signal indicates said first status, wherein said switching is controlled solely by said output signal.

* * * * *